United States Patent [19]
Roza

[11] Patent Number: 6,087,968
[45] Date of Patent: Jul. 11, 2000

[54] ANALOG TO DIGITAL CONVERTER COMPRISING AN ASYNCHRONOUS SIGMA DELTA MODULATOR AND DECIMATING DIGITAL FILTER

[75] Inventor: Engel Roza, Eindhoven, Netherlands

[73] Assignee: U.S. Philips Corporation, New York, N.Y.

[21] Appl. No.: 09/060,086

[22] Filed: Apr. 14, 1998

[30] Foreign Application Priority Data

Apr. 16, 1997 [EP] European Pat. Off. ............. 97201128

[51] Int. Cl.[7] ................................................. H03M 3/00
[52] U.S. Cl. ........................................... 341/143; 341/159
[58] Field of Search ............................ 341/61, 143, 144, 341/122, 110, 159; 375/206, 242, 317, 354

[56] References Cited

U.S. PATENT DOCUMENTS

| | | | |
|---|---|---|---|
| 4,954,824 | 9/1990 | Yamada et al. | 341/122 X |
| 5,274,372 | 12/1993 | Luthra et al. | 341/61 |
| 5,396,244 | 3/1995 | Engel | 341/143 |
| 5,504,751 | 4/1996 | Ledzius et al. | 341/144 |
| 5,640,416 | 6/1997 | Chalmers | 375/206 |
| 5,963,160 | 10/1999 | Wilson et al. | 341/143 |

OTHER PUBLICATIONS

Shinichi Fukuda, "A New Digital PLL for the Class I Partial Response Channel," IEEE Transactions, Sep. 1996.

Engel Roza, "Poly–Phase Sigma–Delta Modulation," IEEE Transactions, Nov. 1997.

"Analog–to–Digital Conversion via Duty–Cycle Modulation", by Engel Roza, IEEE Transactions on Circuits and Systems, vol. 44, No. 11, Nov. 1997, pp. 907–914.

"The Application of Delta Modulation to Analog–to–PCM Encoding", by David J. Goodman, The Bell System Technical Journal, vol. 48, No. 2, Feb. 1969, pp. 321–343.

"Asynchronous Delta Sigma Modulation", by C.J. Kikkert et al., Proceedings of the IREE, vol. 36, Apr. 1975, pp. 83–87.

"Recursive Bitstream Conversion", by Engel Roza, IEEE Transactions on Circuits and Systems, vol. 40, No. 2, Feb. 1993, pp. 65–72.

*Primary Examiner*—Michael Tokar
*Assistant Examiner*—Patrick Wamsley
*Attorney, Agent, or Firm*—Steven R. Biren

[57] ABSTRACT

An analog to digital converter comprises an asynchronous sigma-delta modulator generating an asynchronous duty cycle modulated square wave, sampling means to synchronously sample the asynchronous square wave and a decimating digital filter to convert the samples from the sampling means into a desired PCM-format.

6 Claims, 4 Drawing Sheets

ANALOG TO DIGITAL CONVERTER COMPRISING AN ASYNCHRONOUS SIGMA DELTA MODULATOR AND DECIMATING DIGITAL FILTER

BACKGROUND OF THE INVENTION

This invention relates to an analog to digital converter comprising a sigma-delta modulator followed by a decimating digital filter. This analog to digital converter is e.g. known from the article: "The Application of Delta Modulation to Analog to PCM Encoding" By D. J. Goodman, published in "The Bell System Technical Journal", Volume 48, nr Feb. 2, 1969.

The continuing decrease of the component size of modern CMOS-integrated circuits necessitates a reduction in the circuit supply voltage for reasons of maintaining a high standard of reliability. The supply voltage may conveniently be reduced to values as low as 3 Volts or lower. However such a low supply voltage is a nuisance for A/D (analog to digital) conversion schemes based on sample, hold and amplitude quantization, because of the entailed reduction in the resolution available within the amplitude range. On the other hand, the decrease of the component size has a beneficial effect on the obtainable time resolution in the circuitry, owing to the increase in the intrinsic speed of the transistors.

Therefore it is advantageous to use an A/D-conversion scheme where the information of the analog signal is turned from the amplitude axis to the time axis and when subsequently the time axis, rather than the amplitude axis, is quantized. This can conveniently be implemented by means of a synchronous sigma-delta modulator which is followed by a decimating digital filter, as is described in the above mentioned publication.

A synchronous sigma-delta modulator basically consists of a feedback loop comprising a clock-pulse switched comparator, whose binary output signal is combined with the analog input signal and wherein the combined signal is fed to the input of the comparator. Conventionally the combined signal is applied to the input of the comparator through an integrating analog filter, however it is also possible to use instead separate integrating analog filters for the analog input signal and for the binary output signal of the switched comparator prior to their combination.

The output signal of the comparator consists of a stream of synchronous binary (two-valued) samples (e.g. 0 and 1, or −1 and +1), whereby the number of samples of one value per unit of time is approximately proportional to the amplitude of the analog input signal. The bit-rate of the binary samples is determined by the rate of the clock-pulses which switch the comparator. The binary output signal of the synchronous sigma-delta modulator is subsequently applied to a decimating digital filter which transforms the binary signal to a bit-parallel digital signal at lower clock rate, so that a pulse code modulated (PCM) signal is obtained. The above mentioned publication proposes a digital transversal filter followed by a subsampling circuit for this function.

A drawback of the above described A/D-converter is that for broadband signals, such as video signals, the clock-frequency of the synchronous sigma-delta modulator has to be rather high, so that it is difficult to realize a reliable, simple and robust arrangement with present day integrating techniques. The difficulty is that in the case of such synchronous sigma-delta modulation a decision operation has to be carried out on a very weak input signal in a very small time at a high repetition rate. Practical decision switches, which consist of clocked bistable circuits, do not fulfil all these requirements because they are not able to sufficiently quickly restore from their previous decision operation. Consequently, the decisions made by the switch are unreliable, resulting in increased noise. The invention has for its object to provide a more reliable A/D-converter of the kind described in the preamble and the analog to digital converter according to the invention is characterized in that the sigma-delta modulator is an asynchronous sigma-delta modulator, generating an asynchronous duty cycle modulated square wave, and that between the output of the asynchronous sigma-delta modulator and the decimating digital filter clock-controlled sampling means are provided. Therefore, unlike in the case of synchronous sigma-delta modulation, the clock controlled sampler is now placed outside the loop of the sigma-delta modulator. In the proposed configuration, the decision is executed on large input signals, resulting in a much more robust operation.

An asynchronous sigma-delta-modulator consists of a feedback configuration with an integrating lowpass filter and a comparator, in which the output of the comparator, combined with the input signal, is fed to the input of the lowpass filter. The comparator is not switched by an externally applied clock pulse. The asynchronous sigma-delta modulator, if properly designed, generates an asynchronous square wave. The generated square wave has a duty cycle which is approximately linearly dependent on the input signal and an instantaneous frequency which is non-linearly dependent on the input signal.

Such asynchronous sigma-delta modulator, which is simple, does not require any clocking, matches well with mainstream CMOS-technology and can operate at low currents and supply voltage, is known per se e.g. from an article by C. J. Kikkert et al., "Asynchronous Delta Sigma Modulation". Proceedings of the IREE of Australia, Vol. 36, April 1975, pp. 83–88.

The second step in the AD-conversion process is the discretization of the time axis. This may be done by sampling the duty cycle modulated asynchronous square wave, generated by the asynchronous sigma-delta modulator, at a sufficiently high clock rate. This sampling results in a stream of two-valued synchronous samples which, if subjected to a holding operation over the entire sampling period, would result in a duty cycle modulated square wave with synchronous leading and trailing edges, which is approximately similar to the asynchronous square wave generated by the asynchronous sigma-delta modulator. The difference between the edge positions of the asynchronous square wave and the edge positions of the synchronized equivalent, may be considered as the quantization noise. This quantization noise is smaller the higher the clock rate is at which the sampler operates.

The binary output pulses of the sampler are subsequently processed by the decimating digital filter for obtaining a suitable digital format such as a PCM-signal. The decimating digital filter may comprise a digital transversal filter, as is described in the above mentioned article of D. J. Goodman. Another solution for the decimating digital filter may comprise a recursive bitstream converter, as described by the inventor in IEEE Transactions on Circuits and Systems, 40, nr. 2, pp 65–72 of February 1993. Such recursive bitstream converter is conceptually equivalent to a comb-filter, followed by a subsampler and a spectrum correction filter.

SUMMARY OF THE INVENTION

Because, according to the invention, the clock controlled sampler is configured outside the loop of the sigma-delta modulator, there is no quantization noise reduction by feedback. To compensate for this, the clock rate of the sampler can be further increased. However, especially when high frequency signals such as video signals have to be processed, the clock rate may then become unpractically high.

In order to overcome this drawback the analog to digital converter of the present invention may be further characterized in that the clock controlled sampling means comprise a polyphase sampler. Then the sampling can be done at a much lower frequency than in the case of a single phase sampler. The asynchronous duty cycle modulated square wave of the sigma-delta modulator may then be fed into a delay line having a large number of taps, so that each tap delivers an asynchronous square wave which is time shifted with respect to the square wave of the preceding tap. All the time shifted square waves are then simultaneously sampled at the lower frequency sampling rate.

An even more attractive configuration is obtained when, according to a still further aspect of the invention, the polyphase sampler comprises a clock controlled string of delay cells for delivering a number of phase shifted sampling pulses, and a number of samplers, controlled by said phase shifted sampling pulses, said samplers simultaneously receiving the asynchronous duty cycle modulated square wave of the sigma-delta modulator. The advantage of this configuration is that a more precise phase alignment can be achieved, especially when the polyphase sampler comprises clock controlled means to control the delay of the delay cells.

BRIEF DESCRIPTION OF THE DRAWING

These and other aspects of the invention will be described with reference to the attached figures.

DETAILED DESCRIPTION OF THE PREFERRED EMBODIMENTS

Figure 1:
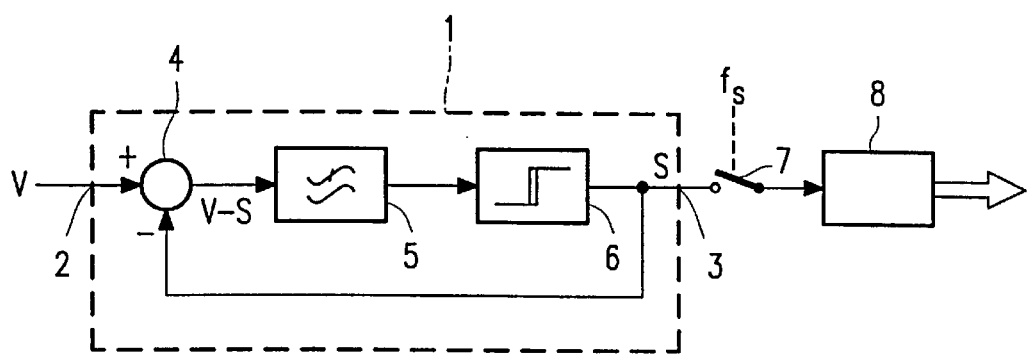
FIG. 1 shows a first embodiment of an analog to digital converter according to the invention.

The analog to digital converter of FIG. 1 comprises an asynchronous sigma-delta modulator 1. This modulator contains an input terminal 2, to which an analog input signal v may be applied, and an output terminal 3 for deriving an output signal s. The input signal v and the output signal s are subtracted from each other in a subtracter 4 and the difference signal v−s, so obtained, is lowpass filtered in a lowpass filter (integrator) 5. Subsequently the lowpass filtered difference signal is fed to a comparator (hard limiter) 6 to derive the output signal s. Preferably, the filtered difference signal is compared with zero-level, so that, for example, the comparator 6 generates a first output level (+1) when the filtered difference signal is positive and a second output level (−1) when this signal is negative.

The subtracter 4, the lowpass filter 5 and the comparator 6 are arranged in a feedback loop which generates a square wave. The duty cycle τ/T of the generated square wave is approximately linearly dependent on the input signal v. This dependency may be represented by the formula:

$$\frac{\tau}{T} \approx \frac{1+v}{2} \tag{1}$$

wherein v represents the level of the input signal relative to the level of the output square wave, τ the time the square wave has one value (e.g. "high") and T the period of a complete cycle of the square wave.

The frequency f (=1/T) of the square wave is nonlinearly dependent on the input signal v according to the formula:

$$f/f_c = \omega/\omega_c \approx 1 - v^2 \tag{2}$$

Figure 2:
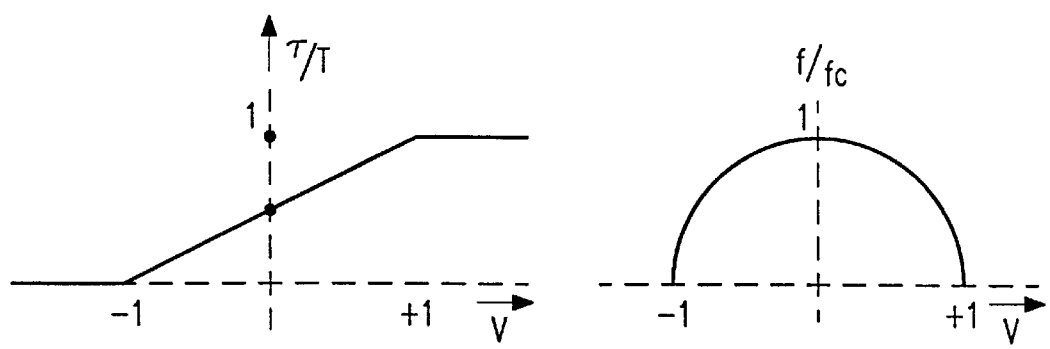
FIGS. 2 and 3(a) through 3(d) show curves for better understanding the operation of the embodiment of FIG. 1.
Figure 3A:
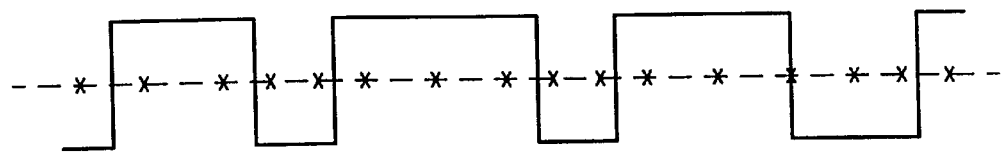
Figure 3B:
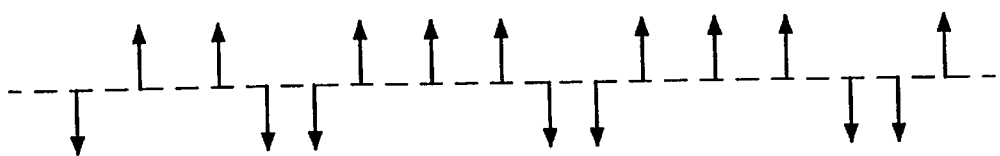
Figure 3C:
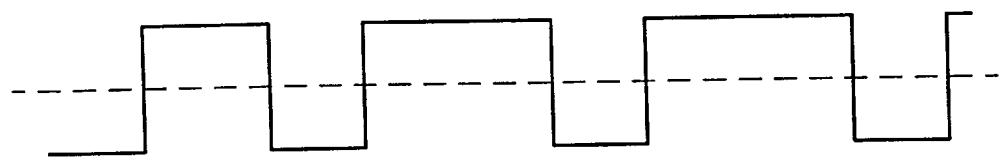
Figure 3D:
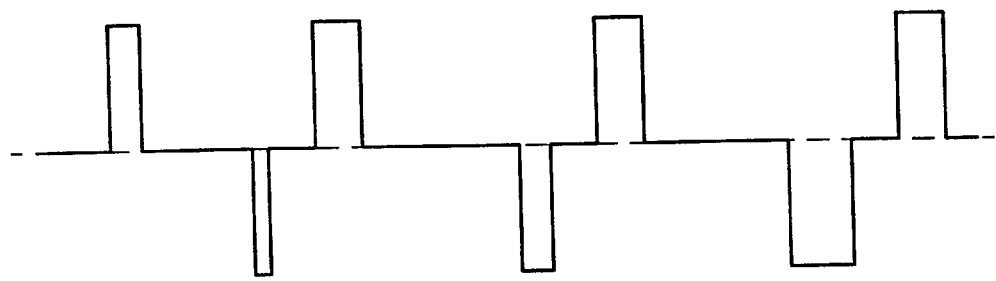

Herein $f_c$ is the central frequency, i.e. the frequency of the square wave when the input signal v=0 and ω and $\omega_c$ are the angular frequencies of f and $f_c$ respectively. FIG. 2 illustrates the dependencies of the duty cycle τ/T and of the frequency f from the input signal v.

The central frequency $f_c$ of the asynchronous sigma-delta modulator is dependent on the poles and zeros of the lowpass filter 5 and on the hysteresis of the comparator 6. For instance, when the lowpass filter has a d.c. unity gain and is of second order with a double pole at angular frequency p and a zero at angular frequency z (p∝z), then it can be found for the angular central frequency $\omega_c = 2\pi f_c$ that:

$$\omega_c \approx \frac{p^2}{z} \cdot \frac{\pi}{2} \cdot \frac{1}{h} \tag{3}$$

where h represents the relative value of the hysteresis of the comparator, i.e. the output signal of the comparator switches from −1 to +1 and vice versa, when the input signal of the comparator crosses the values h and −h. From the above formula (3), it follows that, at zero input signal, the asynchronous sigma-delta modulator 1 oscillates at a frequency $f_c$ of 32 Mhz when p=2*10$^6$ sec$^{-1}$, z=200*10$^6$ sec$^{-1}$ and h=π/2*10$^{-4}$. It follows from formula (2) that, when the input signal varies from, for example, v=−½ to v=½, the frequency f varies from ¾ $f_c$, through $f_c$ back to ¾ $f_c$. It has to be remarked that the function of the hysteresis in the above formula (3) is not necessary but can also be fulfilled, wholly or partly, by a delay element in the feedback loop.

The square wave of the asynchronous sigma-delta modulator is subsequently applied to a sampler 7, which is controlled by a clock signal of frequency $f_s$ and which transforms the asynchronous duty cycle modulated square wave to a series of synchronous samples. FIG. 3 shows typical waveforms of the sampling process. In this figure, curve a) shows the asynchronous square wave and crosses, representing the instants at which the synchronous sampling occurs. Curve b) shows the samples generated by the sampler 7. In this example it is assumed that the sampler generates a +1 sample when the value of the square wave at the sampling instant is +1 and that the sampler generates a −1 sample when the value of the square wave is −1 at that instant. Of course it is also possible that the sampler generates bits having other binary values, such as 1 and 0. Because the duty cycle of the square wave is proportional to the input signal v, the number of samples of one value per unit of time (i.e. the density of these samples) is proportional to the input signal. More particularly: when v=1 all samples are of one value (e.g. high), when v=0 the number of samples of one value and the number of samples of the other value are equal and when v=−1 all samples have the second value ("low").

If the samples would be applied to a hold circuit which holds the sample-value until the next sample occurs, the square wave of FIG. 3 curve c) would result. The waveform, shown in FIG. 3 curve d), represents the difference between the square waves of curves a) and c). This is the error signal which is introduced by the sampler. This error signal, in sofar as it influences the converted signal within the bandwidth of interest, may be viewed as the quantization noise introduced by the sampler. This quantization noise is lower when the sampling frequency $f_s$ is higher.

Finally, the samples from the sampler 7 are fed into a suitable logic arrangement for converting the bitstream into any desired digital format such as e.g. a PCM format. Several possible arrangements for this function are already indicated in the introductory part of this application.

A practical A/D-converter according to the invention may be dimensioned according to the following considerations:

1. Because the asynchronous sigma-delta modulator is not an ideally linear duty cycle modulator, harmonic distortion will be generated. If e.g. the bandwidth of the signal to be converted is 3 Mhz, the most serious harmonic distortion occurs with a sinusoidal input signal $v=v_m*\sin(2\pi\mu t)$ having maximum amplitude ($v_m=1$) and a signal-frequency $\mu=1$ Mhz, because this is the highest frequency whose third harmonic falls within the bandwidth of interest. In this case, for the third harmonic distortion to remain below −40 db, th center frequency of the asynchronous sigma-delta modulator should be made about 32 Mhz. This can be achieved as explained earlier by properly dimensioning of the lowpass filter 5 and the hysteresis of the comparator 6.

2. As it is already described above, the quantization noise can be decreased by increasing the sampling frequency $f_s$. It has been found that if, in the arrangement described sofar, the quantization noise should be −46 db below signal level, the sampling frequency $f_s$ should be about 2 GHz.

3. A third point to consider is the level of aliasing introduced by the modulator. To safeguard a low distortion level for single tone modulation, it is advantageous to deemphasize high input frequencies by some first order lowpass filtering (not shown in FIG. 1). In that case the aliasing level of the arrangement above described, was found to be negligible.

Figure 4:
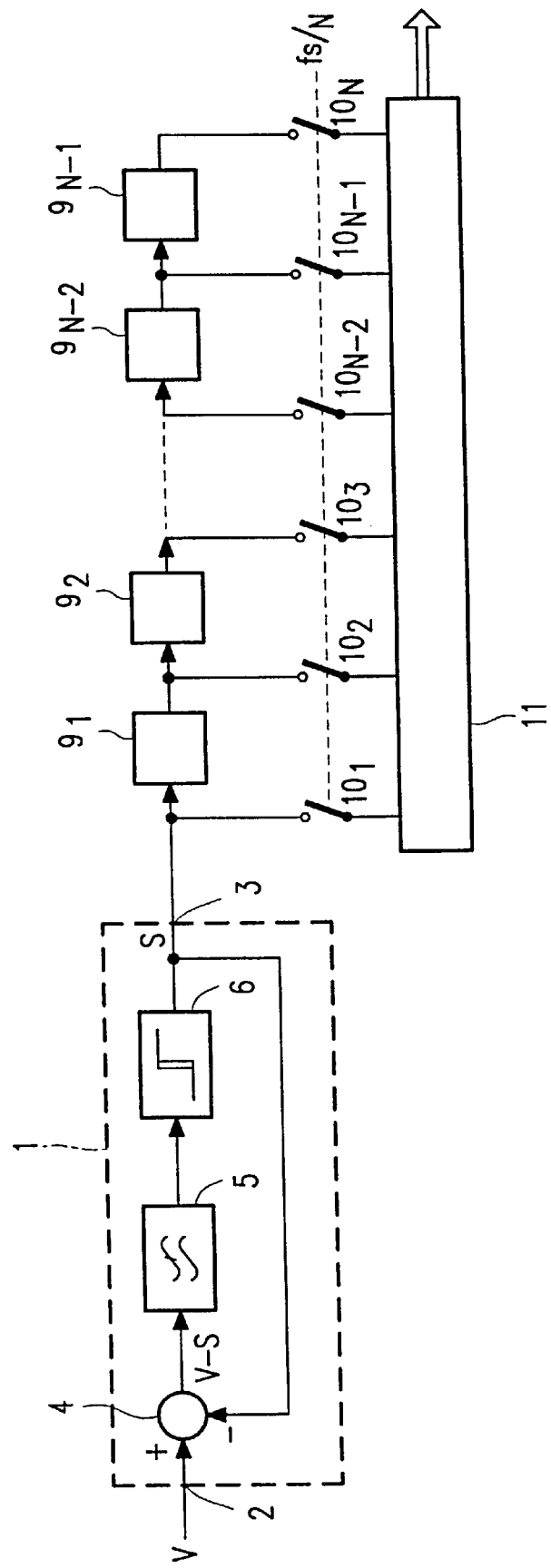
FIG. 4 shows a second embodiment of an analog to digital converter according to the invention and FIG. 5 shows a third embodiment of an analog to digital converter according to the invention.

An interesting alternative for the A/D-converter of FIG. 1 is shown in FIG. 4. In this figure circuit elements, which correspond with those in FIG. 1, are indicated by the same reference numerals. In this alternative the square wave of the asynchronous sigma-delta modulator is fed into a delay line of N−1 delay cells $9_1 \ldots 9_{N-1}$, whereby each cell causes a delay of e.g. 500 ps. Because the delay line operates on a square wave, it can conveniently be implemented by a string of inverters. The delay line provides N taps. each of these taps being connected to a sampler $10_1 \ldots 10_N$. These samples operate simultaneously under the control of a clock signal of a frequency $f_s/N$, which may be a factor N lower than the sampling frequency of the arrangement of FIG. 1. The N samplers deliver a parallel sampled polyphase output which is fed to a decimating digital filter 11 for converting the samples into a PCM format.

A still more attractive arrangement is shown in FIG. 5 in which, again, the circuit elements, corresponding with those of FIG. 1, have the same reference numeral The arrangement of this figure comprises a string of inverting delay cells $12_1 \ldots 12_N$, which string is closed in a ring so that it functions as a ring oscillator. A phase detector 13 receive a clock signal $f_s/N$ and the pulse signal generated by the ring oscillator. The phase detector 13 generates a control signal, which, after being filtered in a lowpass filter 14, controls the delay of all the delay cells $12_1 \ldots 12_N$, so that the pulse signal, generated by the ring oscillator, is locked to the clock frequency $f_s/N$, thereby constituting what is usually referred to as a "delay locked loop". The string of delay cells has N taps which control N samplers $15_1 \ldots 15_N$. The pulse signal in the ring travels from tap to tap and consequently the samplers $15_1 \ldots 15_N$ are sequentially switched. The output square wave of the asynchronous sigma-delta modulator is fed to all samplers $15_1 \ldots 15_N$ simultaneously, so that the sequentially switched samplers sample the square wave in sequence. The N samplers are fed to decimating digital filter 16 for conversion into a suitable digital format.

Figure 5:
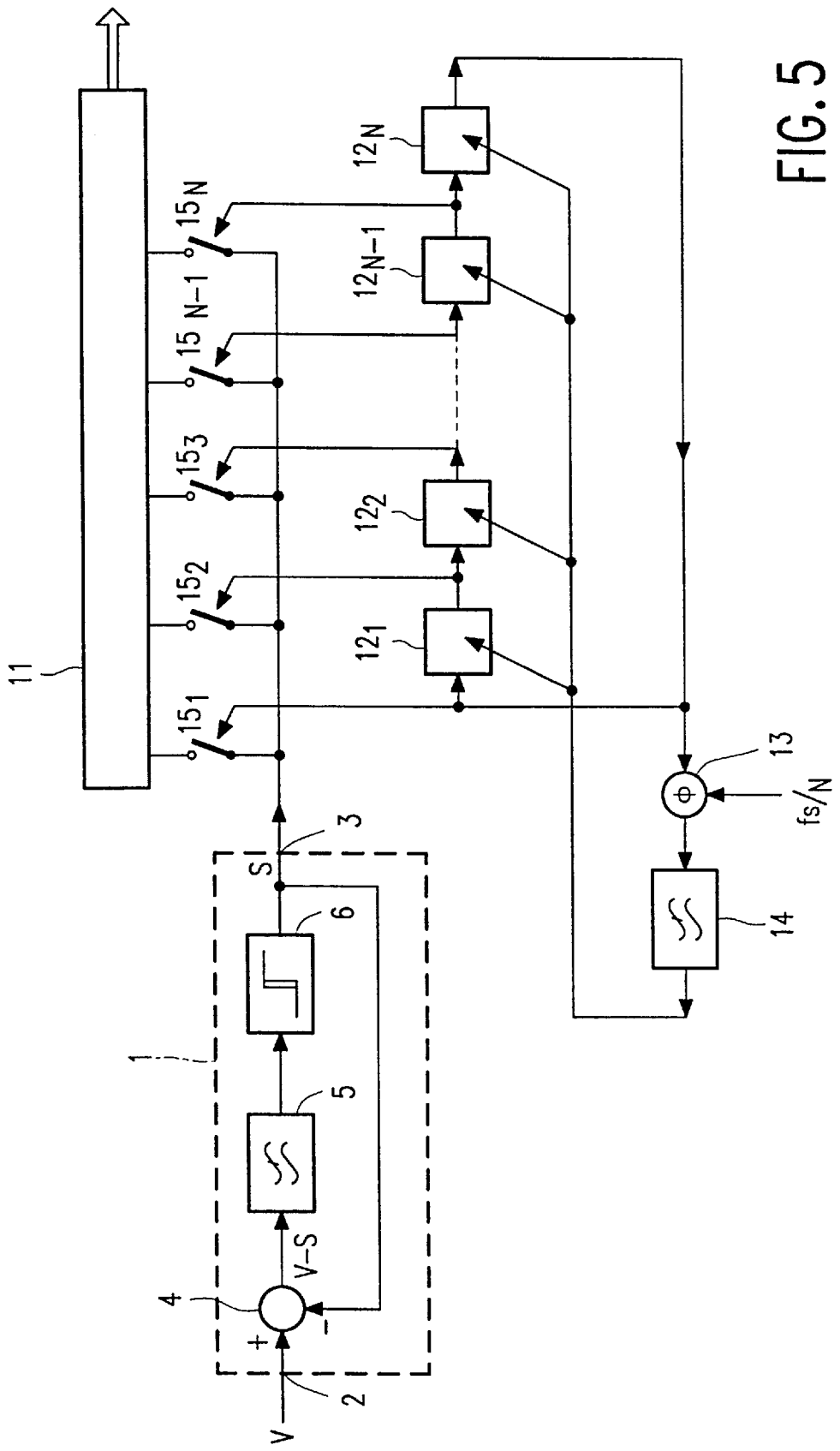

The advantage of the arrangements of FIGS. 4 and 5 is that each sampler is operated at a much lower frequency than the single sampler of FIG. 1. When e.g. N=40, the clock frequency in FIGS. 4 and 5 can be made 50 MHz, which is a very suitable value. The advantage of the arrangement of FIG. 5 over that of FIG. 4 is that the delay of the delay cells is kept under control, so that a precise phase alignment is achieved.

The delay locked loop of FIG. 5 may be modified in that the string of delay cells is not closed to a ring, the clock signal is fed to the input of the delay string, and the input and output of the delay string (or two other taps of the string) are compared in the phase detector for control of the delay of the cells. Such kind of delay locked loop is known per se e.g. from the publication "Esscirc' 95, Lille France 19–21 September 1995" pp. 50–53.

A doubling of the effective sampling frequency and a corresponding further decrease of the sampling noise can be obtained with the same clock frequency and the same number of delay cells. This can be achieved if the delay cells have balanced outputs and each of these outputs drive one sampler. With such arrangement and a clock frequency of 50 MHz, 40 delay cells each having 250 ps delay and 80 samplers, an effective sampling frequency of 4 GHz is obtained.

An important field of application of the A/D converter of the present invention is the A/D conversion of bandpass signals e.g. the 38.9 MHz video IF signal in TV-receivers. For such kind of application the same effective sampling frequency fs as for base band signals of the same bandwidth can be used, because the bandwidth of the input signal and not the center frequency thereof, determines the value of the required sampling frequency. The frequency of the square wave of the asynchronous sigma-delta modulator has to be increased to at least twice the carrier frequency of the input signal.

What is claimed is:

1. An analog to digital converter comprising:
   an asynchronous sigma-delta modulator coupled to the input of the analog to digital converter for modulating an amplitude of an input signal and comprising a comparator which is not switched by an externally applied clock signal, said asynchronous sigma-delta modulator being configured to generate an asynchronous duty cycle modulated signal as an output;
   a decimating digital filter; and
   a clock-controlled sampler coupled between the asynchronous sigma-delta modulator and the decimating digital filter.

2. The analog to digital converter as claimed in claim 1, wherein the clock controlled sampler comprises a polyphase sampler.

3. The analog to digital converter as claimed in claim 2, wherein the polyphase sampler comprises a clock controlled string of delay cells for delivering phase shifted sampling pulses, and a plurality of samplers, controlled by the phase shifted sampling pulses, the plurality of samplers simultaneously receiving the asynchronous duty cycle modulated signal of the asynchronous sigma-delta modulator.

4. The analog to digital converter as claimed in claim 3, further comprising a clock circuit configured to control the delay of the delay cells.

5. The analog to digital converter as claimed in claim 1, wherein the analog to digital converter comprises CMOS technology.

6. The analog to digital converter as claimed in claim 1, wherein the analog to digital converter is configured to operate using a supply voltage of less than or equal to three volts.

\* \* \* \* \*